United States Patent [19]

Court et al.

[11] Patent Number: 5,438,673

[45] Date of Patent: Aug. 1, 1995

[54] AUTOMATIC INTERFACE FOR CPU REAL MACHINE AND LOGIC SIMULATOR DIAGNOSTICS

[75] Inventors: Thomas L. Court; Lawrence T. Hsu; Alan Rivers, all of Eau Claire, Wis.

[73] Assignee: Cray Research, Inc., Egan, Minn.

[21] Appl. No.: 113,724

[22] Filed: Aug. 27, 1993

Related U.S. Application Data

[63] Continuation of Ser. No. 569,068, Aug. 17, 1990, abandoned.

[51] Int. Cl.$^6$ .............................................. G06F 9/455
[52] U.S. Cl. ................................ 395/500; 364/578; 364/DIG. 1; 371/22.1; 395/183.14; 395/700
[58] Field of Search ..................... 364/578; 371/16.1; 395/500

[56] References Cited

U.S. PATENT DOCUMENTS

| | | | |
|---|---|---|---|
| 4,636,942 | 1/1987 | Chen et al. | 395/725 |
| 4,817,093 | 3/1989 | Jacobs et al. | 371/22.3 |
| 4,918,594 | 4/1990 | Onizuka | 395/500 |
| 5,051,938 | 9/1991 | Hyduke | 395/500 |

OTHER PUBLICATIONS

Andrew S. Tanenbaum, *Structured Computer Organization*, Prentice Hall, 1984, pp. 10-12.

*Primary Examiner*—Robert B. Harrell
*Assistant Examiner*—William M. Treat
*Attorney, Agent, or Firm*—Schwegman, Lundberg & Woessner

[57] ABSTRACT

A method for performing diagnostics on a CPU logic simulator executes certain portions of the diagnostics on a real-machine, and other portions in the software simulator. Those portions that must be executed in the simulator are executed on the simulator, while those portions that need not be executed on the simulator are preferably executed on the real-machine. The method coordinates the execution of the diagnostic functions between the real-machine and the simulator to achieve improved speed of diagnostic execution.

1 Claim, 3 Drawing Sheets

AUTOMATIC INTERFACE FOR CPU REAL MACHINE AND LOGIC SIMULATOR DIAGNOSTICS

This is a continuation, of application Ser. No. 07/569,068, filed Aug. 17, 1990, now abandoned.

TECHNICAL FIELD OF THE INVENTION

The present invention pertains generally to the field of logic simulation, and more particularly to the testing of a CPU design by running diagnostics on a logic simulator for the design.

BACKGROUND OF THE INVENTION

A logic simulator is a software program or electronic device that emulates exactly how the logic it simulates will function. It is primarily used to verify the integrity of new designs, but can also be used to evaluate the performance of new and existing designs. The present invention is a software-driven simulator wherein computer program variables are used to represent boolean logic terms and program statements are used to evaluate the boolean equations of the design.

For further explanation of the logic simulation technique utilized by the present invention, see the copending and commonly assigned application Ser. No. 07/570,120, now U.S. Pat. No. 5,276,854, entitled "METHOD FOR MULTIPLE CPU LOGIC SIMULATION", and filed Aug. 17, 1990, the entire contents of which are hereby incorporated by reference herein.

There are three distinct levels at which a designer may use a logic simulator in the design of a computer system. The first level consists of testing a piece of logic that may be part of a module or I. C. option design. The second level is testing at the module level. Inputs are specified in a special file, and outputs (or any boolean terms) can be monitored to see if they come out as expected. The third level of simulation is at the system level. Simulation at the system level is an efficient and effective way to check the design correctness of control logic and other system aspects which depend on proper interaction of the various modules of the system.

System level simulation allows testing of the system design by emulating the execution of diagnostics, a rigorous test of design correctness. Using diagnostics, one need only check the pass and error counts to determine if a diagnostic passed or failed, and correspondingly the correctness of the design. If it failed, the diagnostic is run again and again while tracing relevant terms, much like probing on a real piece of hardware, or stepping through a program with a debugger to find software problems. Also, with multiple CPU systems (i.e., multiprocessor systems), diagnostics can be used to thoroughly test important areas of the machine design like the memory port and inter-CPU communications logic.

Preferably, the same diagnostics that are to be run in systems test and checkout for the completed hardware itself are the ones that are run in the simulator. Usually, diagnostics that exist for the hardware of prior generations of the system design can be used in whole or in part for this purpose. However, it is not practical to run most real-machine diagnostics in their entirety in a simulator because a software simulation of a CPU "runs" on the order of a million times slower than an actual CPU. For example, a diagnostic that runs 1,000 passes per second on an actual CPU would take over sixteen minutes to complete a single pass in a software-simulation of the CPU. Accordingly, there is a strong need for methods in which to speed up the execution of diagnostics in software-simulated CPUs.

SUMMARY OF THE INVENTION

The method of executing real-machine diagnostics in a software simulator wherein the real-machine diagnostics comprise a plurality of functions. The method includes identifying those functions which should be run on the real-machine, and those which need to be run in the software simulator. The method calls for executing those functions that must be run in the software simulator in the software simulator; while executing at least some of those functions that may be run on the real-machine on the real-machine. The method further includes coordinating the functions executed between the real-machine and the simulator to provide a diagnostic check-out of the simulated system.

DETAILED DESCRIPTION OF THE INVENTION

Figure 1:
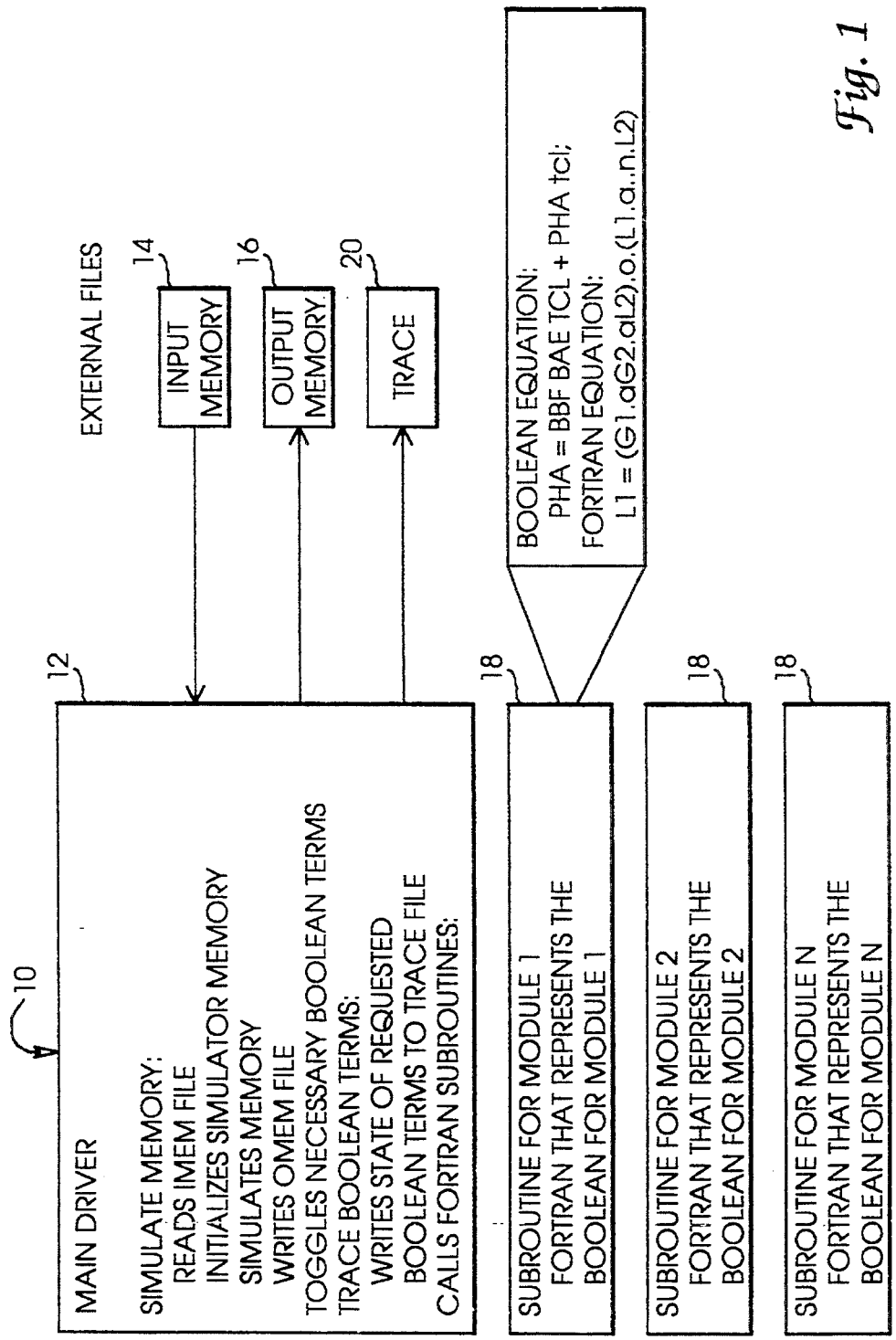
FIG. 1 shows a diagrammatic representation of a software simulator for a computer system.

Generally, as shown in FIG. 1, a logic simulator program 10 comprises a main driver 12 and a collection of program modules 18. The main driver 12 emulates system "memory"; reads an input memory file (IMEM) 14; writes to an output memory file (OMEM) 16; calls the program modules or subroutines 18 in proper order; displays or outputs requested boolean terms in a trace file 20; and toggles or changes the value of boolean terms under user control. The IMEM file 14 contains initial data or values for program variables (i.e., initial logic states), simulated memory or registers, or a combination of initial values and instructions. The modules 18 consist of computer program statements that represent the boolean equations for a portion of the logic being simulated. Typically, one module 18 represents the boolean for one hardware module in a system. Simulator 10 is executed on a host-machine (not shown).

Figure 2:
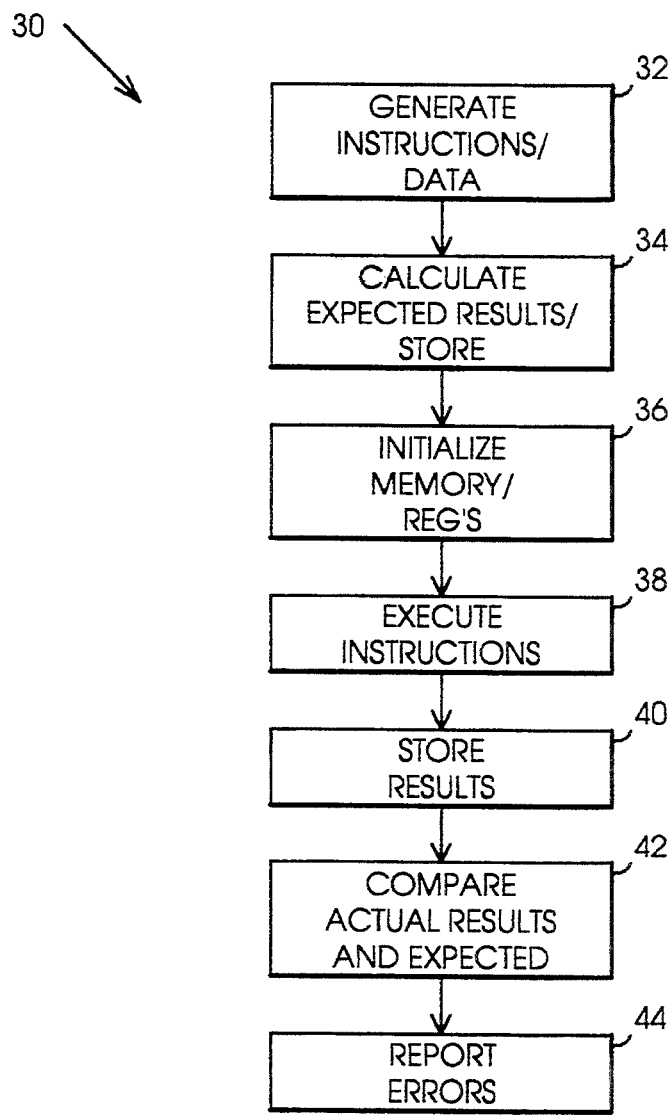
FIG. 2 is a block diagram of real-machine hardware diagnostic.

Generally, as shown in FIG. 2, a real-machine hardware diagnostic program 30 includes a routine 32 which generates a set of random instructions and data (based on a starting seed value) that are to be executed on the machine; a routine 34 to calculate the results expected from the executed random instructions and data; and a routine 36 to clear and initialize system memory and registers. The diagnostic 30 further includes routines 38 and 40 for causing the machine to execute the random instructions and for storing the actual results to memory. Finally, the diagnostic includes routines 42 and 44 to compare the actual results with the expected results, and to detect and report errors. If no errors are detected, a new seed value is used to generate another set of random instructions and data and another pass through the diagnostic is performed. As indicated above, such diagnostics, when executed in a real-machine, may run over 1,000 passes per second. However, when such a diagnostic is "run" on a software simulator of a machine, a single pass can take up to sixteen minutes.

Figure 3:
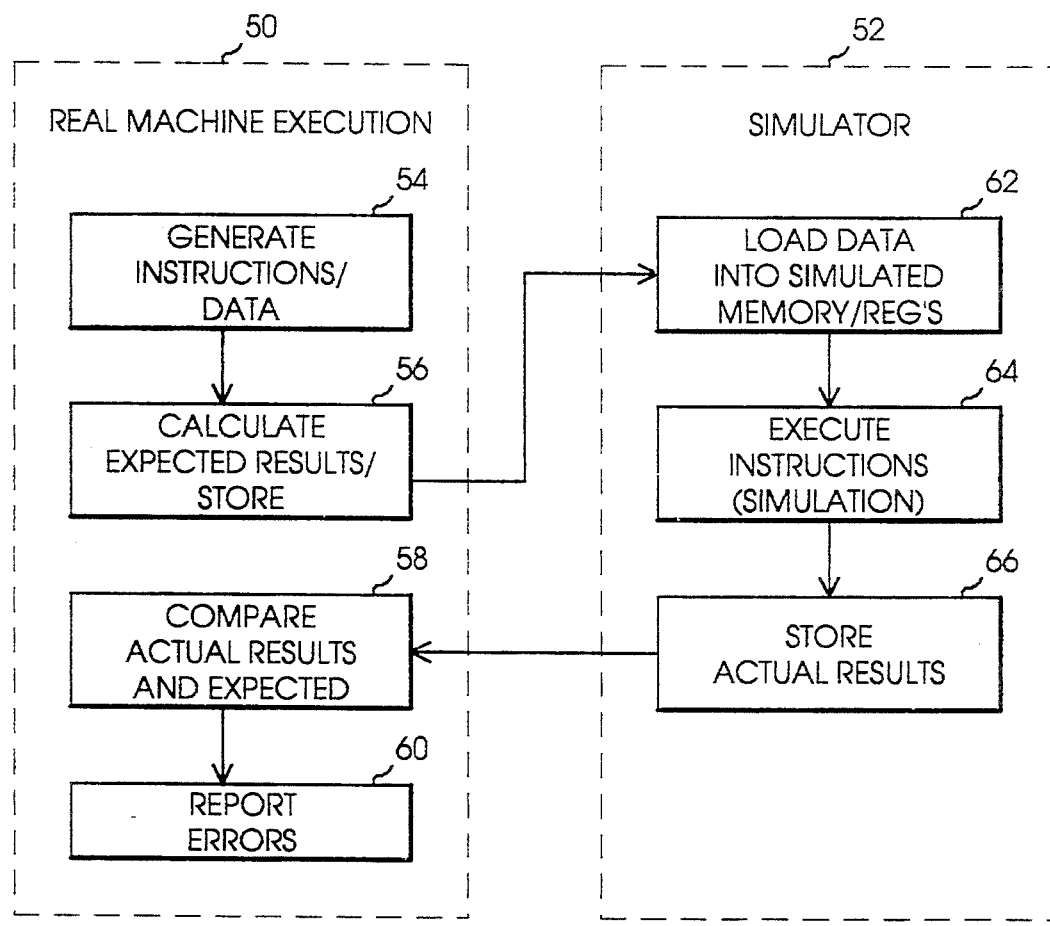
FIG. 3 is a block diagram of a method of running a diagnostic in a software simulator of a computer system according to the present invention.

The present invention comprises a method of reducing the run time of a real-machine diagnostic in a software simulator of a machine. Generally, the invention divides the software components of the diagnostic into those that can be run directly in the real-machine host for the software simulator, and those that must be run in the simulator itself. In FIG. 3, these components are shown in respective groups 50 and 52. Those components that can be run in the real-machine include:

(a) the routine for generating random instructions and data (54);

(b) the routine for calculating and storing expected results (56);

(c) the routine for comparing actual and expected results (58); and (d) the routine for error reporting (60).

The components of the diagnostic to be "run" in the simulator include:

(a) the routine for loading and/or clearing of the simulated registers and memory (62);

(b) the routine for executing random instructions (64); and (c) the routine for storing the actual results to simulated memory (66).

Where the diagnostic program is not used for system verification and debug the diagnostic program can be run directly on the real-machine host. A logic simulator state switch allows smooth, transparent transitions between execution in the real-machine host and execution in the simulator. In preferred embodiment of the present invention, the state of the registers and memory are carried across the switch. For example, if a switch from execution in the simulator to execution in the real-machine host is taking place, the contents of the simulator's memory and registers are passed to the real-machine host's memory and registers. Similarly for switches from the real-time host to the simulator.

Thus, the logic simulator state switch allows the user of a CPU Logic Simulator to execute certain parts of a diagnostic on the host system instead of in the logic simulator (assuming the host system has the same instruction set as the CPU that is being simulated). The switch between the host system (hardware mode) and the logic simulator (simulation mode) is transparent, in that the state of the registers and memory are carried across the switch. For example, if a switch from simulation mode to hardware mode is taking place then the contents of the memory and the registers in the simulator, at the time of the switch, will be passed to the hardware's memory and registers. The same is true when making the switch from hardware mode to simulation mode.

The method is intended to be used with diagnostics that have a large amount of support code that doesn't really test the CPU being simulated. Examples of support code would be random test data generation, random instruction generation, generation of expected data, compare routines, etc.

The switch from simulation mode to hardware mode requires approximately 1200 clock periods (in the logic simulator), so it is not feasible to switch when only a small amount of code is going to get executed in hardware mode. In that case, the simulator would execute the code.

Exchanges between simulation mode and hardware mode can be accomplished using, for example, an exchange operation. Such an operation is disclosed, for example, in U.S. Pat. No. 4,636,942, entitled "Computer Vector Multi-processing Control," the disclosure of which with respect thereof is hereby incorporated by reference herein.

Set forth below is the basic flow of the method of executing diagnostics in a simulator according to the present invention.

1. The CPU being simulated is deadstarted and starts executing the monitor code.

2. After the monitor completes its initialization it exchanges to the diagnostic. The diagnostic starts executing.

3. A switch interrupt is encountered in the diagnostic, this causes an exchange back to the monitor.

4. The monitor determines that the diagnostic is requesting that a switch to hardware mode be performed. It then jumps to the switch interrupt handler routine.

5. The switch interrupt handler saves the contents of desired CPU registers to a reserved area in memory, sets the switch flag and waits for the hardware to take over and complete.

6. The simulator main driver (which is constantly monitoring the switch flag) sees that the switch flag is set and initiates the switch.

7. The hardware begins executing the diagnostic where the simulator left off. It continues executing until it reaches the address where it's supposed to return to simulation mode.

8. The state of the hardware (memory and registers) is copied back to the simulator memory image, and the switch flag is cleared.

9. The simulator main driver returns to simulation mode.

10. The switch interrupt handler detects that the switch flag is cleared and resumes executing. The saved-off registers are restored and control is returned to the monitor.

11. The monitor exchanges back to the diagnostic and continues to execute from the address that the hardware left off.

Generally, it has been found that the method of present invention speeds up execution of diagnostics in the simulator by a factor of 100 or better.

It is possible to further reduce the simulation run time of a diagnostic by eliminating "unnecessary" code such as multiple iterations of the same section; bypassing set-up routines (like memory clear); reducing address limits and checking only random data patterns (instead of all ones, all zeros, sliding ones, etc.).

Although the invention has been described herein in its preferred form, those skilled in the art will recognize that various modifications and changes may be made thereto without departing from the spirit and the scope of the claims appended hereto.

We claim:

1. A computer implemented method of executing real-machine diagnostics in a software simulator, said real-machine diagnostics comprising a plurality of functions, said method comprising the steps of:

a. executing program code in the computer to:

1. identify those functions which can be run on the real-machine and those which need to be run in the software simulator, and 2. insert a switch interrupt between functions which are to be run on the software simulator and functions which are to be run on the real-machine;

b. executing those functions that must be run in the software simulator in the software simulator;

c. executing at least some of those functions that may be run on the real-machine on the real-machine; and d. coordinating the functions executed between the real-machine and the simulator to provide a diagnostic check-out of the simulated system, wherein the step of coordinating includes the steps of:

1. deadstarting a CPU being simulated so that the CPU begins executing a monitor code;
2. completing a monitor initialization and exchanging to the diagnostic and executing the diagnostic;
3. exchanging back to the monitor when a switch interrupt is encountered in the diagnostic; '4. jumping to the switch interrupt handler routine when the monitor determines that the diagnostic is requesting that a switch to hardware mode be performed;
5. the switch interrupt handler saving the contents of desired CPU registers to a reserved area in memory, setting the switch flag and waiting for the hardware to take over and complete;
6. the simulator main driver (which is constantly monitoring the switch flag) initiating a switch when the simulator main driver detects that the switch flag is set;
7. beginning hardware execution of the diagnostic where the simulator left off, and continuing execution until execution reaches the address where execution runs to simulation mode;
8. copying the state of the hardware (memory and registers) back to the simulator memory image, and clearing the switch flag;
9. the simulator main driver resuming to simulation mode;
10. the switch interrupt handler detecting that the switch flag is cleared and resuming execution, restoring the saved-off registers and resuming control to the monitor; and
11. the monitor exchanging back to the diagnostic and continuing to execute from an address that the hardware left off.

* * * * *

UNITED STATES PATENT AND TRADEMARK OFFICE
CERTIFICATE OF CORRECTION

PATENT NO. : 5,438,673

DATED : August 1, 1995

INVENTOR(S) : Thomas L. Court et al.

It is certified that error appears in the above-indentified patent and that said Letters Patent is hereby corrected as shown below:

Column 5, Line 17, please delete "'4." and insert --4.-- on Line 18 therefore.

Column 6, Line 18, please delete "resuming" and insert --returning-- therefore.

Signed and Sealed this

Twenty-sixth Day of December, 1995

Attest:

BRUCE LEHMAN

*Attesting Officer*     *Commissioner of Patents and Trademarks*